US012419005B2

(12) United States Patent
Yang (10) Patent No.: US 12,419,005 B2
(45) Date of Patent: Sep. 16, 2025

(54) BAFFLE SHROUD ASSEMBLY AND ELECTRONIC DEVICE INCLUDING THE SAME

(71) Applicant: WISTRON CORP., New Taipei (TW)

(72) Inventor: Qi-Hong Yang, New Taipei (TW)

(73) Assignee: WISTRON CORP., New Taipei (TW)

( * ) Notice: Subject to any disclaimer, the term of this patent is extended or adjusted under 35 U.S.C. 154(b) by 545 days.

(21) Appl. No.: 17/934,599

(22) Filed: Sep. 23, 2022

(65) Prior Publication Data

US 2023/0354547 A1 Nov. 2, 2023

(30) Foreign Application Priority Data

Apr. 27, 2022 (TW) ................................. 111116040

(51) Int. Cl.
  *G06F 1/16* (2006.01)
  *H05K 5/00* (2025.01)
  *H05K 7/00* (2006.01)
  *H05K 7/20* (2006.01)

(52) U.S. Cl.
  CPC ............................... H05K 7/20145 (2013.01)

(58) Field of Classification Search
  CPC ........... H05K 7/20145; H05K 7/20136; H05K 7/20009; H05K 7/20181
  See application file for complete search history.

(56) References Cited

U.S. PATENT DOCUMENTS

| 6,047,836 | A  | * | 4/2000  | Miles     | H05K 7/1418  |
|           |    |   |         |           | 211/41.17    |
| 7,344,439 | B2 | * | 3/2008  | Henry     | H05K 7/1445  |
|           |    |   |         |           | 361/679.48   |
| 7,599,183 | B2 | * | 10/2009 | Dittus    | H05K 7/20727 |
|           |    |   |         |           | 361/728      |
| 8,714,666 | B2 | * | 5/2014  | Nagahori  | H05K 7/20181 |
|           |    |   |         |           | 312/236      |
| 9,894,799 | B2 | * | 2/2018  | Oota      | H05K 7/20572 |
| 10,582,638| B2 | * | 3/2020  | Ye        | G06F 1/1681  |
| 12,207,448| B2 | * | 1/2025  | Cheng     | G06F 1/181   |
| 2004/0252453 | A1 | * | 12/2004 | Brooks | H05K 7/20718 |
|           |    |   |         |           | 361/679.51   |
| 2011/0189935 | A1 | * | 8/2011  | Chou   | H05K 7/20718 |
|           |    |   |         |           | 454/284      |
| 2014/0177164 | A1 | * | 6/2014  | Stewart| H05K 13/0486 |
|           |    |   |         |           | 211/26       |

FOREIGN PATENT DOCUMENTS

CN 103188910 A 7/2013
TW I601474 B 10/2017

* cited by examiner

*Primary Examiner* — Anthony M Haughton
(74) *Attorney, Agent, or Firm* — McClure, Qualey & Rodack, LLP (57) ABSTRACT

A baffle shroud assembly includes a baffle shroud, a holding component, and a sheet component, where the baffle shroud has a channel portion and an opening formed and in communication with a side of the channel portion, the holding component is movably disposed on the baffle shroud and located at the opening, the sheet component is swingably disposed on the baffle shroud and in contact with the holding component, and the holding component and the sheet component together cover the opening.

20 Claims, 9 Drawing Sheets

BAFFLE SHROUD ASSEMBLY AND ELECTRONIC DEVICE INCLUDING THE SAME

CROSS-REFERENCE TO RELATED APPLICATIONS

This non-provisional application claims priority under 35 U.S.C. § 119(a) on Patent Application No(s). 111116040 filed in Taiwan (R.O.C.) on Apr. 27, 2022, the entire contents of which are hereby incorporated by reference.

TECHNICAL FIELD

The disclosure relates to a covering structure, more particularly relates to a baffle shroud assembly and an electronic device including the same.

BACKGROUND

An electronic device such as a server or a desktop computer has an enough number of slot connectors on its mainboard to prepare for future upgrades or installation of expansion cards. Also, the space reserved above the slot connectors is large enough to accommodate expansion cards of various sizes (e.g., length or height). In this case, the fan arranged on one side of such space needs to be worked with a baffle shroud, the baffle shroud is provided to ensure that the cooling airflow generated by the fan can be guided to flow through the expansion card. The baffle shroud may also press against the top edge of the expansion card while covering the expansion card, such that the expansion card can be held in position by the baffle shroud.

However, the conventional baffle shrouds are unable to fit different sizes of expansion card. In specific, a typical baffle shroud is exclusive for a specific height of expansion card, thus a baffle shroud used to cover a higher expansion card is unable to press against a shorter expansion card and a baffle shroud for a shorter expansion card is unable to accommodate a higher expansion card. As a result, users need to install additional mechanism on the baffle shroud to compensate the size difference between the expansion card and the baffle shroud or to buy additional baffle shrouds for the respective expansion cards, thereby leading to cost increase and inconvenience in installation and removal processes.

SUMMARY

Accordingly, one aspect of the disclosure is to provide a baffle shroud assembly and an electronic device including the same which are capable of solving the problems caused by conventional baffle shrouds.

One embodiment of the disclosure provides a baffle shroud assembly including a baffle shroud, a holding component, and a sheet component, where the baffle shroud has a channel portion and an opening formed and in communication with a side of the channel portion, the holding component is movably disposed on the baffle shroud and located at the opening, the sheet component is swingably disposed on the baffle shroud and in contact with the holding component, and the holding component and the sheet component together cover the opening.

One embodiment of the disclosure provides an electronic device adapted for an expansion card and including a housing and a baffle shroud assembly, where the baffle shroud assembly includes a baffle shroud, a holding component, and a sheet component, the baffle shroud is disposed on the housing and has a channel portion and an opening formed and in communication with a side of the channel portion, the channel portion is configured to accommodate the expansion card, the holding component is movably disposed on the baffle shroud and located at the opening, the holding component is configured to press against the expansion card, the sheet component is swingably disposed on the baffle shroud and in contact with the holding component, the holding component and the sheet component together cover the opening.

According to the baffle shroud assembly and the electronic device as discussed in the above embodiments of the disclosure, the baffle shroud for covering the expansion card has a holding component movably disposed at an opening at a side of its channel portion and configured to press against the expansion card, thus the holding component of the baffle shroud assembly is suitable for pressing against expansion cards in different sizes, and the holding component and the sheet component are able to cover the opening, making the baffle shroud assembly suitable for holding expansion cards in different sizes while capable of effectively guiding cooling air for them. As such, the application of the baffle shroud assembly is not affected by the size difference among expansion cards, thereby effectively solving the problem that the conventional baffle shrouds are available for one specific size of expansion card.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Aspects and advantages of the disclosure will become apparent from the following detailed descriptions with the accompanying drawings. The inclusion of such details provides a thorough understanding of the disclosure sufficient to enable one skilled in the art to practice the described embodiments but it is for the purpose of illustration only and should not be understood to limit the disclosure. On the contrary, it is intended to cover alternatives, modifications, and equivalents as can be included within the spirit and scope of the described embodiments as defined by the appended claims. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features.

It is to be understood that the phraseology and terminology used herein are for the purpose of better understanding the descriptions and should not be regarded as limiting. Unless specified or limited otherwise, the terms "mounted," "connected," and variations thereof are used broadly and encompass both direct and indirect mountings and connections. As used herein, the terms "substantially" or "approximately" may describe a slight deviation from a target value, in particular a deviation within the production accuracy and/or within the necessary accuracy, so that an effect as present with the target value is maintained. Unless specified or limited otherwise, the phrase "at least one" as used herein may mean that the quantity of the described element or component is one or more than one but does not necessarily mean that the quantity is only one. The term "and/or" may be used herein to indicate that either or both of two stated possibilities. The phrase "in fluid communication with" or "in communication with" may be used to mean that fluid (liquid and/or gas) is allowed to flow between two spaces, areas, slots, holes, channels and/or openings.

Figure 1:
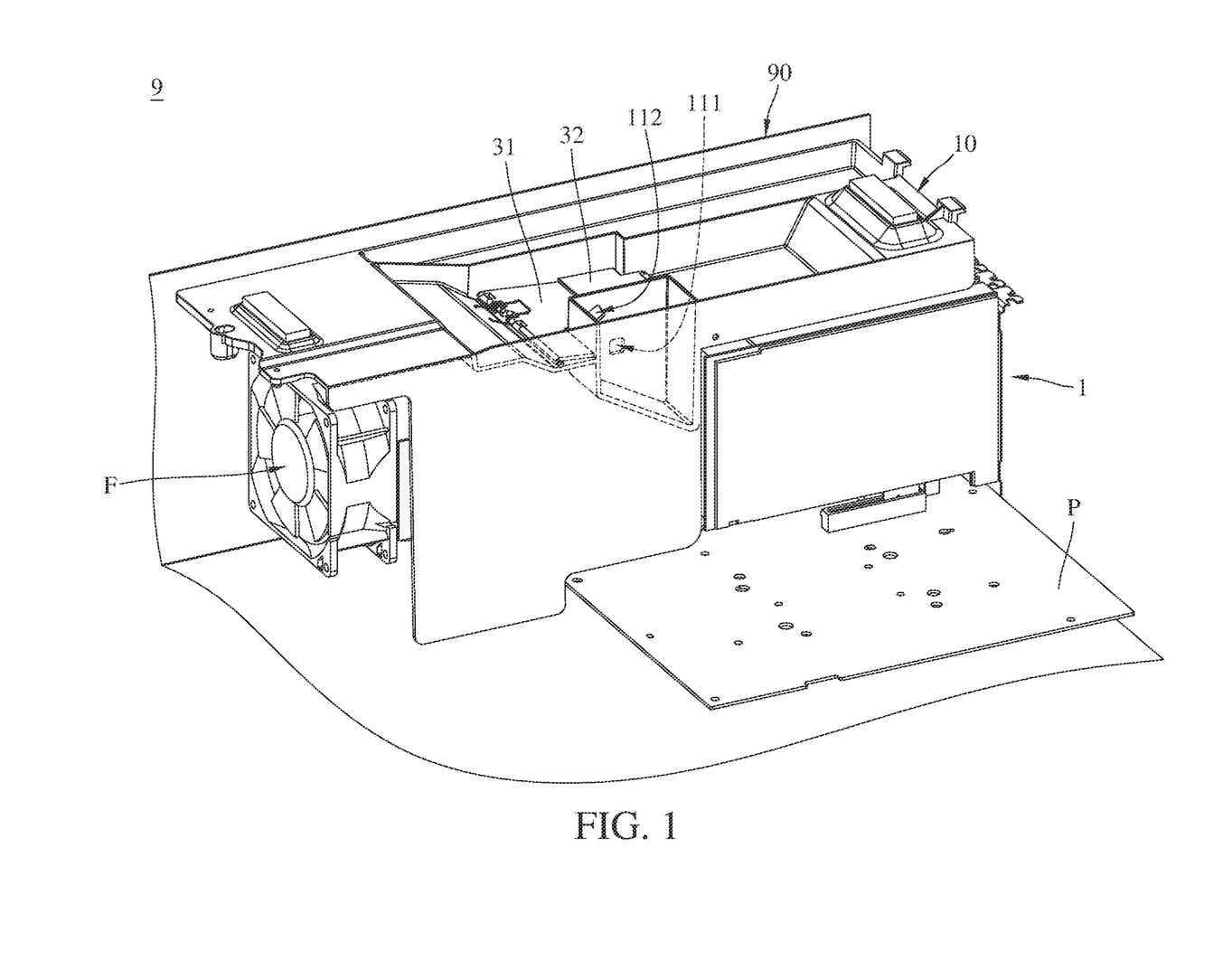
FIG. 1 is a partially enlarged perspective view of an electronic device with a baffle shroud assembly according to one embodiment of the disclosure.

Firstly, referring to FIG. 1, one embodiment of the disclosure provides a baffle shroud assembly 1 and an electronic device 9. The electronic device 9 may be, but is not limited to, a server, desktop computer, or part thereof. The electronic device 9 may include a housing 90 configured to accommodate the baffle shroud assembly 1. Note that the housing 90 and its design are not limiting. As shown, a circuit board P may be disposed on the housing 90, there may be one or more slot connectors (not numbered) disposed on the circuit board P for the insertion of electrical elements (e.g., an expansion card E in FIG. 7 or an expansion card E' in FIG. 8). The circuit board P is provided for better understanding the baffle shroud assembly 1 and the circuit board P and slot connectors thereon and numbers thereof are not limiting. The baffle shroud assembly 1 may be detachably or removably disposed in the housing 90 by any suitable manner. When the baffle shroud assembly 1 is in the housing 90, at least part of the baffle shroud assembly 1 is located above the slot connectors of the circuit board P. Thus, the baffle shroud assembly 1 is able to cover the electrical element inserted into the slot connector. In addition, there may be one or more fans F disposed on the housing 90 and configured to generate airflow to the space surrounded by the baffle shroud assembly 1, and the electrical element covered by the baffle shroud assembly 1 can be cooled by the airflow. The fan F is provided for better understanding the baffle shroud assembly 1 and the fan F and its design and number are not limiting.

Figure 2:
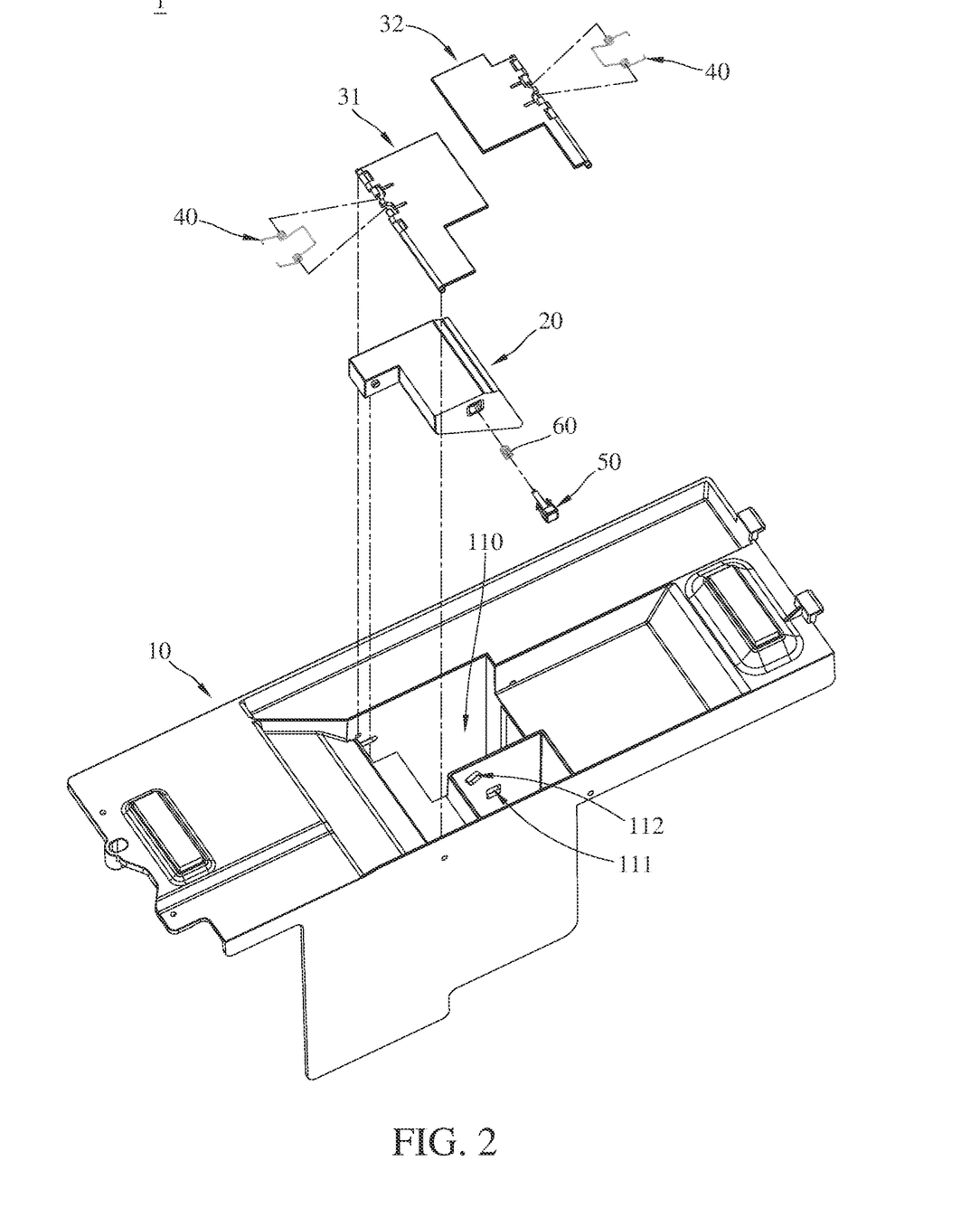
FIG. 2 is an exploded view of a baffle shroud assembly according to one embodiment of the disclosure.
Figure 3:
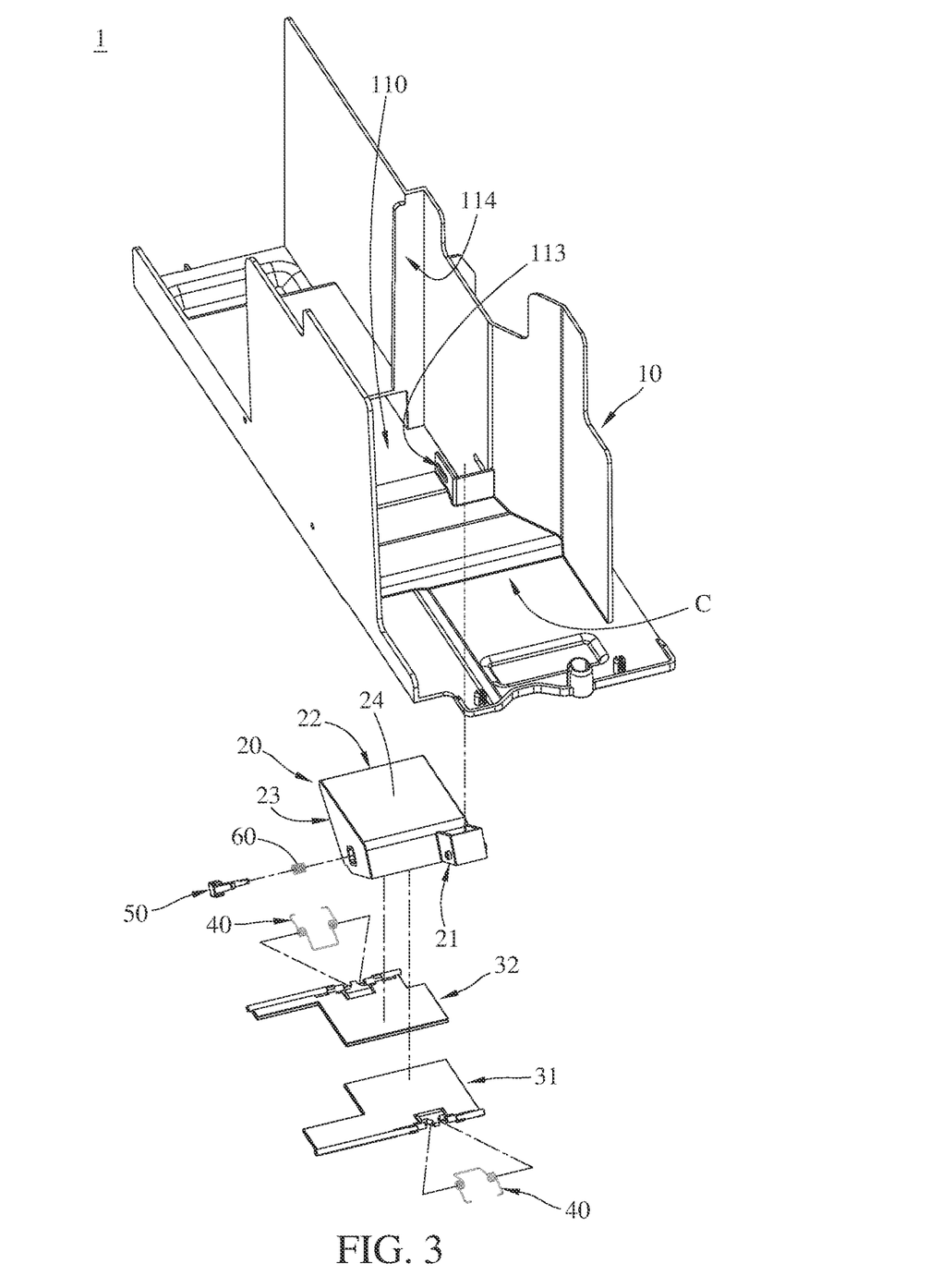
FIG. 3 is another exploded view of a baffle shroud assembly according to one embodiment of the disclosure.
Figure 4:
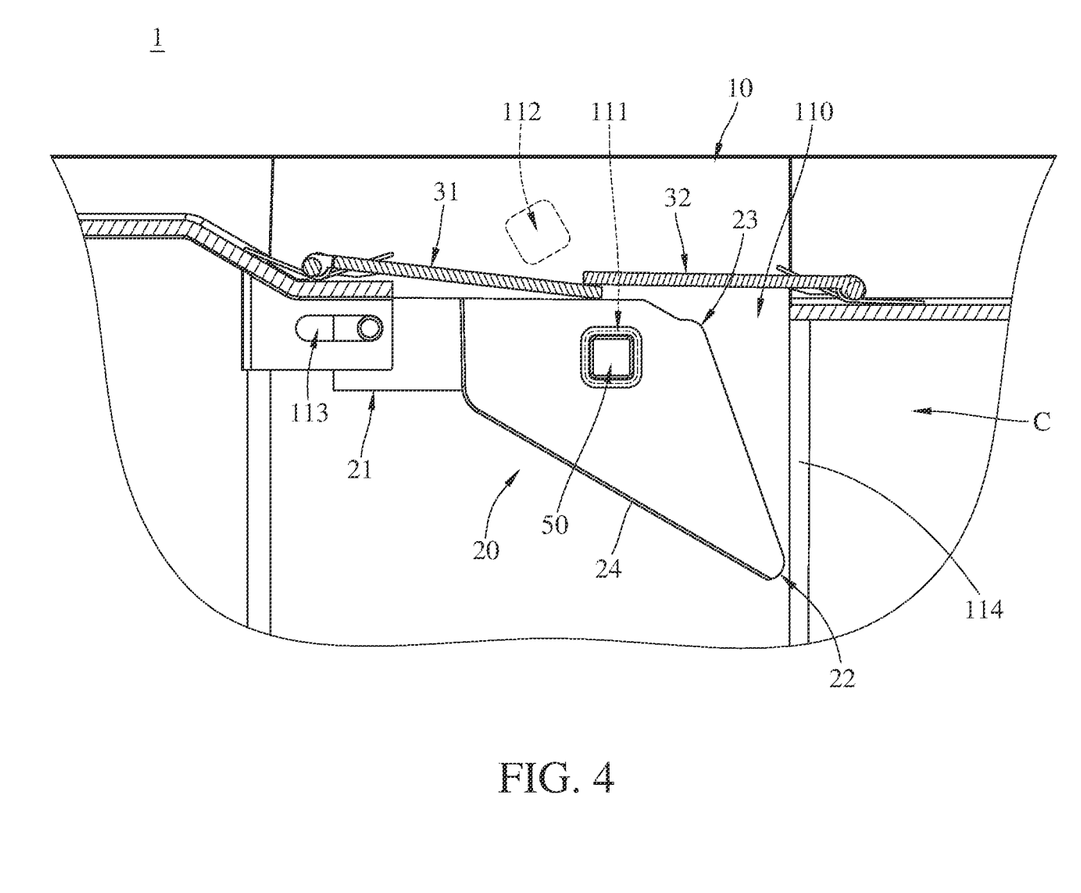
FIG. 4 is a partially enlarged cross-sectional view of a baffle shroud assembly according to one embodiment of the disclosure when its holding component is in a first position.
Figure 5:
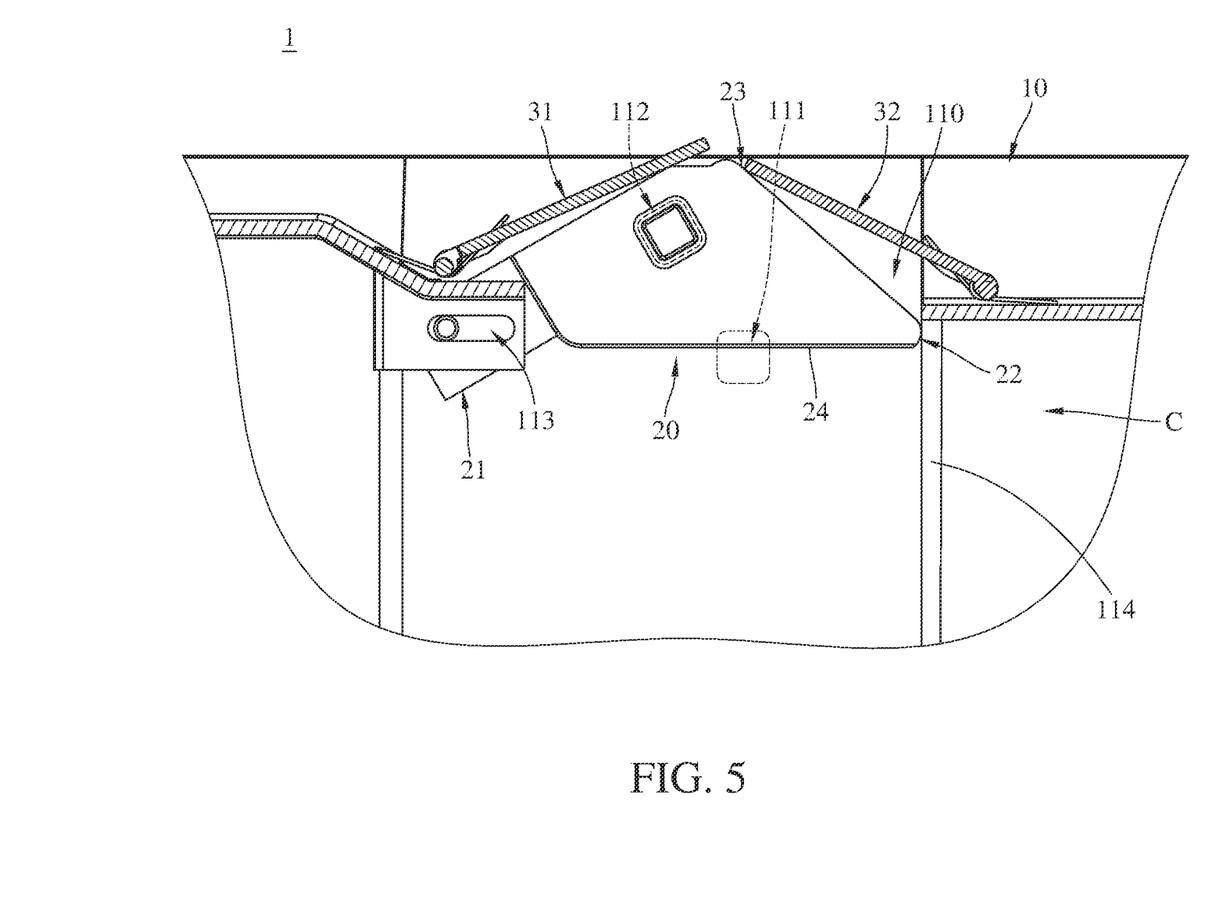
FIG. 5 is a partially enlarged cross-sectional view of a baffle shroud assembly according to one embodiment of the disclosure when its holding component is in a second position.
Figure 6:
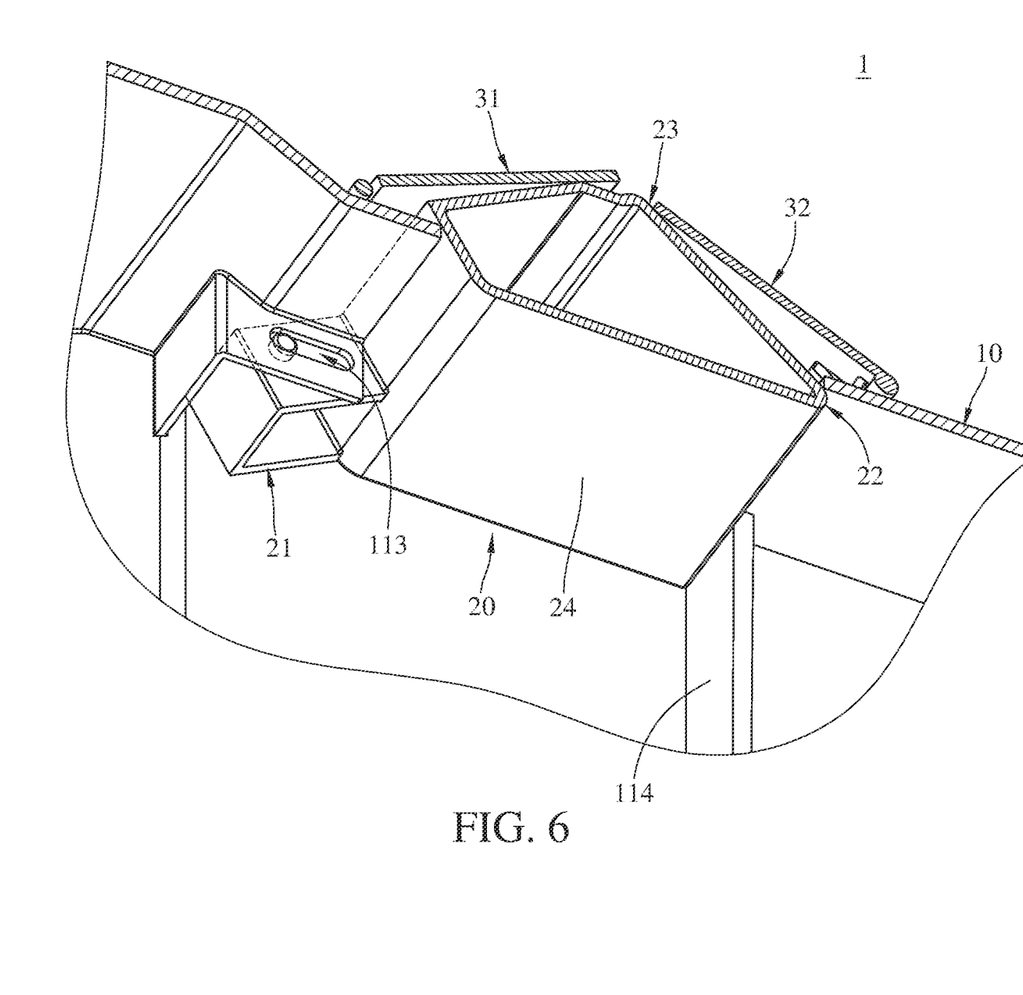
FIG. 6 is a partially enlarged perspective view of the baffle shroud assembly in FIG. 5.
Figure 7:
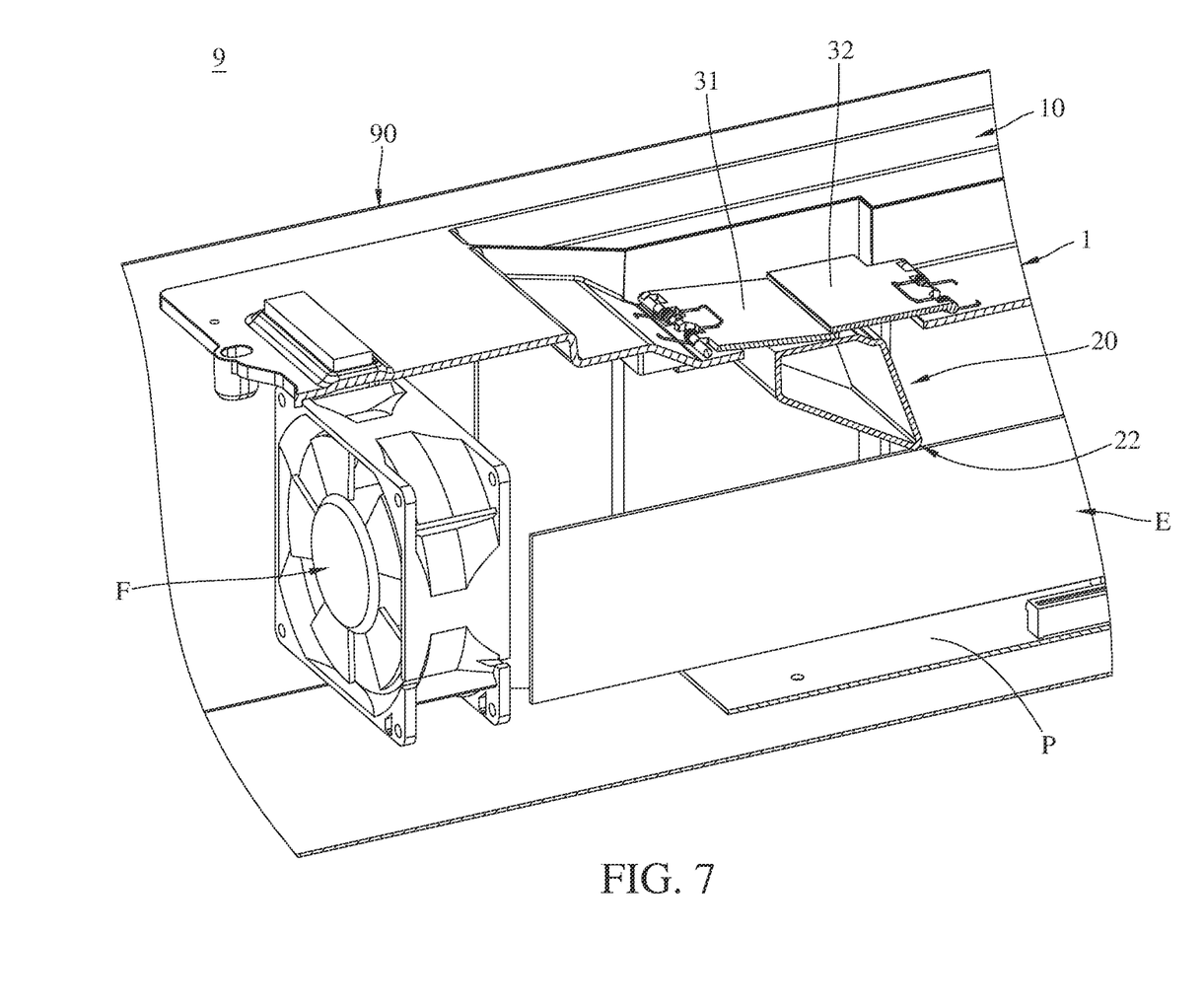
FIG. 7 is a partially enlarged perspective view of an electronic device according to one embodiment of the disclosure when a holding component of its baffle shroud assembly is in a first position.
Figure 8:
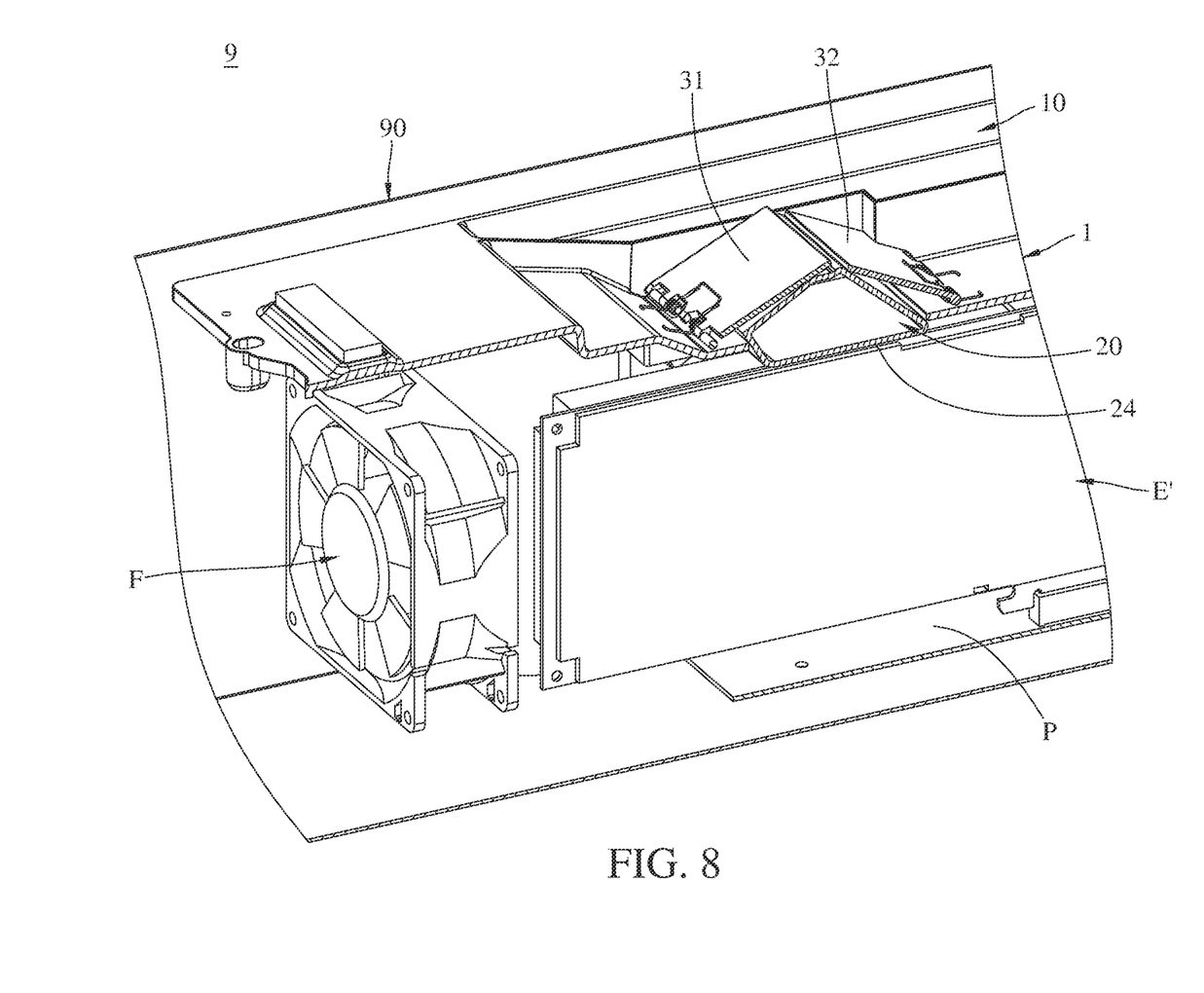
FIG. 8 is a partially enlarged perspective view of an electronic device according to one embodiment of the disclosure when a holding component of its baffle shroud assembly is in a second position.

Then, please refer to FIG. 1 and further refer to FIGS. 2-3, in this embodiment, the baffle shroud assembly 1 may include a baffle shroud 10, a holding component 20, and at least one sheet component (e.g., a sheet component 31 and a sheet component 32). The baffle shroud 10 may be detachably or removably disposed on the housing 90 by any suitable manner. The holding component 20 is movably disposed on the baffle shroud 10 and has a first position (as shown in FIGS. 4 and 7) and a second position (as shown in FIGS. 5-6 and 8). The sheet components 31 and 32 may be pivotably or swingably disposed on the baffle shroud 10. The sheet components 31 and 32 are in contact with the holding component 20 and therefore may be moved by the holding component 20.

The baffle shroud 10 means the part of the baffle shroud assembly 1 configured to cover the electrical element inserted into the slot connector on the circuit board P. The baffle shroud 10 defines a channel portion C with two opposite openings at two opposite sides of the baffle shroud 10. The channel portion C is served as a passage for airflow generated by the fan F. As such, the baffle shroud 10 is able to receive airflow generated by the fan F from one end thereof and then guide the airflow to flow through the channel portion C and thereby continuously taking away the heat generated by the electrical element covered by the baffle shroud 10. It is noted that the baffle shroud 10, its material, and the shape and size of its channel portion C may be changed or modified as required and are not intended to limit the disclosure. In addition, in this embodiment, the baffle shroud 10 may have an opening 110 exposing the top portion of the channel portion C; in other words, the baffle shroud 10 may have an opening 110 in fluid communication with a side of the channel portion C. In specific, when the baffle shroud 10 is disposed in the housing 90, the opening 110 is located at a side of the channel portion C located opposite to the circuit board P. The opening 110 provides room for the position switching of the holding component 20, which is favorable for having a suitable overall height while the baffle shroud 10 has a holding component 20 thereon.

The holding component 20 is movably located at the opening 110 of the baffle shroud 10. The position of the holding component 20 relative to the baffle shroud 10 may be selectively changed; in other words, the position of the holding component 20 relative to the circuit board P or the electrical element on the circuit board P may be selectively changed. In specific, the holding component 20 may be pivotably and slidably disposed at the opening 110 of the baffle shroud 10. In this embodiment, the holding component 20 may include a mount portion 21, the baffle shroud 10 may have a guide slot 113, the guide slot 113 may be a straight slot, and the mount portion 21 may be a protrusion pivotably and slidably disposed through the guide slot 113. With the cooperation of the guide slot 113 and the mount portion 21, the holding component 20 is able to slide and rotate relative to the baffle shroud 10 at the same time.

Further, the holding component 20 may further include at least one pressing portion (e.g., a first pressing portion 22 and a second pressing portion 24) and a top portion 23. The first pressing portion 22 is located at one end of the holding component 20 and may be tapered. The first pressing portion 22 may be located opposite to the mount portion 21; in other words, the first pressing portion 22 and the mount portion 21 may be respectively located at two opposite ends of the holding component 20. The top portion 23 may be connected between the mount portion 21 and the first pressing portion 22 and may be tapered towards a direction different from the first pressing portion 22. The second pressing portion 24 may be a flat surface connected between the mount portion 21 and the first pressing portion 22 and located opposite to the top portion 23 (in other words, the top portion 23 and the second pressing portion 24 may be respectively located at two opposite sides of the holding component 20). As discussed, the mount portion 21, the first pressing portion 22, the top portion 23, and the second pressing portion 24 may be respectively located at different sides of the holding component 20. The first pressing portion 22 and the second pressing portion 24 may be respectively used to press against electrical elements of different sizes covered by the baffle shroud 10 when the holding component 20 switches to different positions. In specific, the first pressing portion 22 may be used to press against an expansion card E as shown in FIG. 7 when the holding component 20 is in the first position, and the second pressing portion 24 may be used to press against an expansion card E' as shown in FIG. 8 when the holding component 20 is in the second position, and the expansion card E and the expansion card E' may be different in height; for example, the expansion card E in FIG. 7 may be shorter than the expansion card E' in FIG. 8.

The top portion 23 is able to cause the sheet components 31 and 32 to move when the holding component 20 is switched between the first position and the second position. In specific, in this embodiment, the sheet components 31 and 32 may be swingably or pivotably disposed on different sides (e.g., two opposite sides) of the opening 110 of the baffle shroud 10 respectively, and the sheet components 31 and 32 are able to partially cover and force against the holding component 20. For example, each of the sheet components 31 and 32 may cover at least part of the top portion 23 of the holding component 20; in other words, each of the sheet components 31 and 32 may be partially stacked on the top portion 23 of the holding component 20. Thus, when the holding component 20 is switched to the second position from the first position, the top portion 23 may cause the sheet components 31 and 32 to move relative to the baffle shroud 10; in other words, the sheet components 31 and 32 may force the holding component 20 to move back to the first position from the second position by forcing the top portion 23 of the holding component 20.

Optionally, the baffle shroud assembly 1 may further include at least one first elastic component (e.g., two first elastic components 40). Each of the first elastic components 40 may be any suitable torsion spring. One of the first elastic components 40 is connected between the sheet component 31 and the baffle shroud 10, the other first elastic component 40 is connected between the sheet component 32 and the baffle shroud 10, the first elastic components 40 are able to force the sheet components 31 and 32 to pivot towards the holding component 20; in other words, the first elastic components 40 are able to drive the sheet components 31 and 32 to force against the holding component 20. Thus, the sheet components 31 and 32 are kept contacting and covering the top portion 23 of the holding component 20 so that the opening 110 is kept covered while the holding component 20 is switching position. This prevents the airflow flowing through the channel portion C from escaping from the opening 110 to affect the required flow rate of the airflow. In another embodiment, as required, the baffle shroud assembly may omit a first elastic component arranged on one of the sheet components. In other embodiments, the baffle shroud assembly may omit the first elastic components of both sheet components; in such a case, gravitational force acting on the sheet components still can keep the sheet components partially covering the holding component.

In addition, to secure the holding component 20 in the first position or the second position, in this embodiment, the baffle shroud assembly 1 may further include an engaging structure 50 and a second elastic component 60, and the baffle shroud 10 may further have at least one engaging portion (e.g., a first engaging portion 111 and a second engaging portion 112). The engaging structure 50 is movably disposed on the holding component 20. For example, the engaging structure 50 is movably disposed through the holding component 20. The second elastic component 60 may be any suitable compression spring. The second elastic component 60 is connected between the engaging structure 50 and the holding component 20. The first engaging portion 111 and the second engaging portion 112 may be two through holes. When the engaging structure 50 and the second elastic component 60 are released, the second elastic component 60 forces at least part of the engaging structure 50 to stick out the outer surface of the holding component 20. When the engaging structure 50 is forced to further deform the second elastic component 60, the engaging structure 50 is allowed to be submerged into the holding component 20.

In such an arrangement, when the holding component 20 is in the first position, at least part of the engaging structure 50 sticks out the outer surface of the holding component 20 and releasably engaged with the first engaging portion 111 of the baffle shroud 10, thereby securing the first position of the holding component 20. When the holding component 20 is in the second position, at least part of the engaging structure 50 sticks out the outer surface of the holding component 20 and releasably engaged with the second engaging portion 112 of the baffle shroud 10, thereby securing the second position of the holding component 20. In addition, as shown, the first engaging portion 111 and the second engaging portion 112 are arranged at an area of the baffle shroud 10 easily accessed by user's finger. As such, the user can use finger selectively to press the engaging structure 50 at the first engaging portion 111 or the second engaging portion 112, by doing so, the engaging structure 50 can be released from the baffle shroud 10 and therefore cancels the limitation to the holding component 20 and permits the position switching of the holding component 20.

Further, to ensure that the holding component 20 is moved along a predetermined path while switching to the first position or the second position, in this embodiment, the baffle shroud 10 may further have a guiding protrusion 114, the guiding protrusion 114 is configured to guide the first pressing portion 22 of the holding component 20 while the holding component 20 is switching position.

Then, please further refer to FIGS. 4-6 to respectively introduce the first position and the second position of the holding component 20. Firstly, FIG. 4 is a partially enlarged cross-sectional view of the baffle shroud assembly 1 when the holding component 20 is in the first position, at this moment, the holding component 20 is inclined relative to the baffle shroud 10, and the first pressing portion 22 of the holding component 20 are located relatively away from the sheet components 31 and 32 and in contact with the guiding protrusion 114 of the baffle shroud 10, and the second pressing portion 24 of the holding component 20 is inclined. Also, the sheet components 31 and 32 are stacked on the top portion 23 of the holding component 20 so that the sheet components 31 and 32 and the holding component 20 together cover the opening 110 and thereby preventing airflow flowing through the channel portion C from escaping from the opening 110. Optionally, when the holding component 20 is in the first position, the holding component 20 may not protrude from the outer surface of the baffle shroud 10 and distal portions of both the sheet components 31 and 32 may overlap with each other to help prevent air from escaping from the opening 110. Optionally, when the holding component 20 is in the second position, the holding component 20 may protrude from the outer surface of the baffle shroud 10 and the distal portions of both the sheet components 31 and 32 may not overlap with each other.

Then, the holding component 20 may be slide and pivoted relative to the baffle shroud 10 to be switched to the second position so that the holding component 20 in the second position protrudes further from an outer surface of the baffle shroud 10 than that is in the first position. In specific, as shown in FIGS. 5 and 6, when the holding component 20 of the baffle shroud assembly 1 is switched to the second position, the second pressing portion 24 is moved to a horizontal position relative to the baffle shroud 10, and the first pressing portion 22 is moved closer to the sheet components 31 and 32 while keeping contacting the guiding protrusion 114 of the baffle shroud 10. The sheet components 31 and 32 are kept stacking on the top portion 23 of the holding component 20 during this movement of the holding component 20, thus the sheet components 31 and 32 are able to keep preventing air from escaping from the opening 110 during the position switching of the holding component 20. As shown, although at least part of the holding component 20 sticks out the outer surface of the baffle shroud 10 and is located outside of the opening 110, the sheet components 31 and 32 and the holding component 20 are still able to keep covering the opening 110 to effectively preventing airflow from escaping.

Then, please refer to FIGS. 7-8 to respectively introduce how the baffle shroud assembly 1 in the electronic device 9 adopts electrical elements of different sizes by switching position of the holding component 20. Firstly, in FIG. 7, when it is attempted to install a shorter expansion card E, the holding component 20 of the baffle shroud assembly 1 may be switched to the first position, by doing so, the holding component 20 is inclined and its first pressing portion 22 presses against the top edge of the expansion card E to stabilize the installation of the expansion card E; meanwhile, the distal portions of both the sheet components 31 and 32 are overlapping and covering the top portion 23 of the holding component 20, thus the sheet components 31 and 32 and the holding component 20 are able to prevent airflow flowing through the channel portion C from escaping from the opening 110 and thereby ensuring the required flow rate of the airflow for cooling the expansion card E.

Also, as discussed above, when the holding component 20 is in the first position, the engaging structure 50 of the holding component 20 is engaged with the first engaging portion 111 of the baffle shroud 10 so as to secure the holding component 20 in the first position. As such, the holding component 20 is firmly kept in the first position and therefore can stably hold the expansion card E.

Then, in FIG. 8, when it is attempted to install a higher expansion card E', the holding component 20 of the baffle shroud assembly 1 may be switched to the second position. To do so, as discussed above, the engaging structure 50 may be firstly released from the first engaging portion 111 to cancel the limitation that the engaging structure 50 acts on the holding component 20, and then the holding component 20 permitted to switch to the second position relative to the baffle shroud 10. When the holding component 20 is moved to the second position, the space below the holding component 20 is enough to accommodate the expansion card E', and the second pressing portion 24 of the holding component 20 in a horizontal position is able to press against the top edge of the expansion card E' to stabilize the installation of the expansion card E'; meanwhile, although the sheet components 31 and 32 are inclined relative to the baffle shroud 10 by being pushed by the top portion 23 of the holding component 20, the sheet components 31 and 32 are still overlapping and covering the holding component 20 to prevent airflow flowing through the channel portion C from escaping from the opening 110 and thereby ensuring the required flow rate of the airflow for cooling the expansion card E'. Accordingly, the baffle shroud assembly 1 is able to guide cooling air for expansion cards in different sizes.

Similarly, as discussed above, when the holding component 20 is in the second position, the engaging structure 50 on the holding component 20 is engaged with the second engaging portion 112 of the baffle shroud 10 so as to secure the holding component 20 in the second position. As such, the holding component 20 is firmly kept in the second position and therefore can stably hold the expansion card E'.

Accordingly, the baffle shroud assembly 1 is suitable for holding expansion cards in different sizes while guiding cooling air for them, thus its application is not affected by the size difference among expansion cards.

Figure 9:
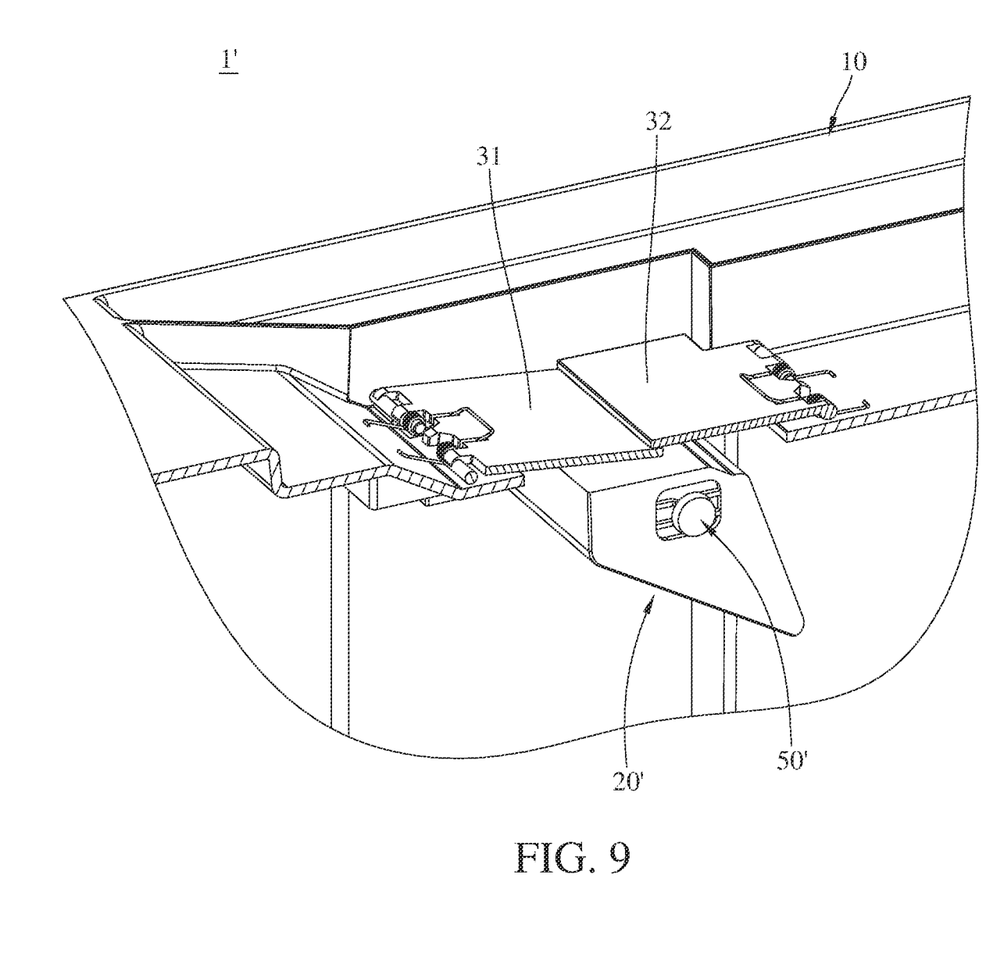
FIG. 9 is a partially enlarged cross-sectional perspective view of a baffle shroud assembly according to another embodiment of the disclosure.

The person having ordinary skill in the art may modify or adjust the baffle shroud assembly of the disclosure as required. For example, please see FIG. 9, another embodiment of the disclosure provides a baffle shroud assembly 1', the main difference between the baffle shroud assembly 1' and the baffle shroud assembly 1 of the previous embodiment is that an engaging structure 50' is integrally formed with a holding component 20' of the baffle shroud assembly 1'; in specific, the engaging structure 50' may be an elastic structure integrally formed on a side of the holding component 20'. In this embodiment, the engaging structure 50' is still able to be releasably engaged with the baffle shroud 10 when the holding component 20' is switched between different positions.

In other embodiments not shown in the drawings, if airflow does not escape from the mount portion of the holding component, the baffle shroud assembly may omit the sheet component that is arranged above the mount portion; that is, the baffle shroud assembly may only have one sheet component. In another embodiment not shown in the drawings, a restoring component (e.g., a torsion spring) may be arranged between the holding component and the baffle shroud to restore the holding component back to the first position. In still another embodiment not shown in the drawings, the holding component may be moved vertically to switch between first and second positions if the space above the baffle shroud assembly is not limiting. In addition, the number of the engaging portions of the baffle shroud may be reduced or increased according to the heights of the expansion cards so that the holding component can be positioned to different angles; in this case, the holding component protrudes out of the baffle shroud, the sheet components and the holding component are still able to cover the opening to prevent airflow flowing through the channel portion from escaping from the opening.

According to the baffle shroud assemblies and the electronic devices as discussed in the above embodiments of the disclosure, the baffle shroud for covering the expansion card has a holding component movably disposed at an opening at a side of its channel portion and configured to press against the expansion card, thus the holding component of the baffle shroud assembly is suitable for pressing against expansion cards in different sizes, and the holding component and the sheet component are able to cover the opening, making the baffle shroud assembly suitable for holding expansion cards in different sizes while capable of effectively guiding cooling air for them. As such, the application of the baffle shroud assembly is not affected by the size difference among expansion cards, thereby effectively solving the problem that the conventional baffle shrouds are available for one specific size of expansion card.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A baffle shroud assembly, comprising:
a baffle shroud having a channel portion and an opening formed and in communication with a side of the channel portion;
a holding component movably disposed on the baffle shroud and located at the opening; and
a sheet component swingably disposed on the baffle shroud and in contact with the holding component;
wherein the holding component and the sheet component together cover the opening.

2. The baffle shroud assembly according to claim 1, wherein the holding component is pivotably and slidably disposed on the baffle shroud.

3. The baffle shroud assembly according to claim 1, wherein the holding component comprises a mount portion, a first pressing portion, and a second pressing portion, the holding component is connected to the baffle shroud via the mount portion, the first pressing portion and the mount portion are respectively located at two opposite ends of the holding component, the second pressing portion is located between the mount portion and the first pressing portion.

4. The baffle shroud assembly according to claim 3, wherein the first pressing portion is tapered, the second pressing portion is a flat surface, the holding component further comprises a top portion connected between the mount portion and the first pressing portion and located opposite to the second pressing portion, the sheet component forces against the top portion.

5. The baffle shroud assembly according to claim 1, further comprising a first elastic component connected between the sheet component and the baffle shroud, wherein the sheet component is driven by the first elastic component to force against the holding component.

6. The baffle shroud assembly according to claim 1, wherein the holding component is movable relative to the baffle shroud and has a first position and a second position, the holding component in the second position protrudes further from an outer surface of the baffle shroud than that is in the first position.

7. The baffle shroud assembly according to claim 1, wherein the sheet component is a first sheet component, the baffle shroud assembly further comprises a second sheet component, the first sheet component and the second sheet component are respectively swingably disposed on two opposite sides of the opening of the baffle shroud, and the holding component, the first sheet component, and the second sheet component together cover the opening.

8. The baffle shroud assembly according to claim 7, wherein the holding component is movable relative to the baffle shroud and has a first position and a second position, when the holding component is in the first position, distal portions of both the first sheet component and the second sheet component overlap with each other, when the holding component is in the second position, the distal portions of both the first sheet component and the second sheet component do not overlap with each other.

9. The baffle shroud assembly according to claim 1, further comprising an engaging structure movably disposed on the holding component, wherein the baffle shroud has an engaging portion, the engaging structure is selectively engaged with the engaging portion.

10. The baffle shroud assembly according to claim 9, further comprising a second elastic component connected between the engaging structure and the holding component, wherein the engaging structure is forced by the second elastic component to engage with the engaging portion.

11. An electronic device, adapted for an expansion card, comprising:
a housing; and
a baffle shroud assembly comprising:
a baffle shroud disposed on the housing and having a channel portion and an opening formed and in communication with a side of the channel portion, wherein the channel portion accommodates the expansion card;
a holding component movably disposed on the baffle shroud and located at the opening, wherein the holding component presses against the expansion card; and
a sheet component swingably disposed on the baffle shroud and in contact with the holding component;
wherein the holding component and the sheet component together cover the opening.

12. The electronic device according to claim 11, wherein the holding component is pivotably and slidably disposed on the baffle shroud.

13. The electronic device according to claim 11, wherein the holding component comprises a mount portion, a first pressing portion, and a second pressing portion, the holding component is connected to the baffle shroud via the mount portion, the first pressing portion and the mount portion are respectively located at two opposite ends of the holding component, the second pressing portion is located between the mount portion and the first pressing portion.

14. The electronic device according to claim 13, wherein the expansion card are pressed by the first pressing portion or the second pressing portion, the first pressing portion is tapered, the second pressing portion is a flat surface, the holding component further comprises a top portion connected between the mount portion and the first pressing portion and located opposite to the second pressing portion, the sheet component forces against the top portion.

15. The electronic device according to claim 11, wherein the baffle shroud assembly further comprises a first elastic component connected between the sheet component and the baffle shroud, and the sheet component is driven by the first elastic component to force against the holding component.

16. The electronic device according to claim 11, wherein the holding component is movable relative to the baffle shroud and has a first position and a second position, the holding component in the second position protrudes further from an outer surface of the baffle shroud than that is in the first position.

17. The electronic device according to claim 11, wherein the sheet component is a first sheet component, the baffle shroud assembly further comprises a second sheet component, the first sheet component and the second sheet component are respectively swingably disposed on two opposite sides of the opening of the baffle shroud, and the holding component, the first sheet component, and the second sheet component together cover the opening.

18. The electronic device according to claim 17, wherein the holding component is movable relative to the baffle shroud and has a first position and a second position, when the holding component is in the first position, distal portions of both the first sheet component and the second sheet component overlap with each other, when the holding component is in the second position, the distal portions of both the first sheet component and the second sheet component do not overlap with each other.

19. The electronic device according to claim 11, wherein the baffle shroud assembly further comprises an engaging structure movably disposed on the holding component, the baffle shroud has an engaging portion, and the engaging structure is selectively engaged with the engaging portion.

20. The electronic device according to claim 19, wherein the baffle shroud assembly further comprises a second elastic component connected between the engaging structure and the holding component, and the engaging structure is forced by the second elastic component to engage with the engaging portion.

* * * * *